United States Patent
Zuckerman et al.

(10) Patent No.: US 8,548,391 B2
(45) Date of Patent: Oct. 1, 2013

(54) USE OF PHOTOVOLTAIC ARRAY STRING WIRING AS ANTENNA AND TRANSMISSION LINE FOR WIRED AND WIRELESS DATA COMMUNICATIONS

(75) Inventors: Lawrence H. Zuckerman, Livermore, CA (US); Perry I. Tsao, Sunnyvale, CA (US); Robert W. Smith, Sonoma, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 436 days.

(21) Appl. No.: 12/928,607

(22) Filed: Dec. 15, 2010

(65) Prior Publication Data

US 2012/0152300 A1 Jun. 21, 2012

(51) Int. Cl.
*H01L 31/042* (2006.01)

(52) U.S. Cl.
USPC ............. 455/73; 136/244; 455/572; 342/368; 342/895

(58) Field of Classification Search
USPC ................ 136/244; 324/76.1; 342/368, 895; 455/129, 572
See application file for complete search history.

(56) References Cited

U.S. PATENT DOCUMENTS

| | | | |
|---|---|---|---|
| 6,232,925 B1 | 5/2001 | Fujikawa | |
| 6,395,971 B1 | 5/2002 | Bendel | |
| 6,590,150 B1 | 7/2003 | Kiefer | |
| 7,840,242 B2 | 11/2010 | Yoshino | |
| 2007/0034247 A1 | 2/2007 | Takada et al. | |
| 2007/0176845 A1* | 8/2007 | Yamazaki et al. | 343/895 |
| 2008/0055177 A1 | 3/2008 | Dixon | |
| 2009/0051592 A1* | 2/2009 | Lee et al. | 342/368 |
| 2012/0056638 A1* | 3/2012 | Swahn | 324/761.01 |

FOREIGN PATENT DOCUMENTS

JP 11031911 A 2/1999

OTHER PUBLICATIONS

Notification of Transmittal of the International Search Report and the Written Opinion of the International Searching Authority, or the Declaration (Form PCT/ISA/220), International Search Report (Form PCT/ISA/210), and the Written Opinion of the International Searching Authority (Form PCT/ISA/237), all Mailed Aug. 29, 2012 in International application No. PCT/US/065132.

* cited by examiner

*Primary Examiner* — Edward Urban
*Assistant Examiner* — Max Mathew
(74) *Attorney, Agent, or Firm* — Eugene C. Conser; W. James Brady; Frederick J. Telecky, Jr.

(57) ABSTRACT

An apparatus includes terminals configured to be coupled to a string wiring of a photovoltaic string. The apparatus also includes a power controller configured to control a power provided over the string wiring by a photovoltaic panel in the photovoltaic string. The apparatus further includes a wireless radio configured to at least one of transmit and receive wireless signals using the string wiring as an antenna. The wireless signals contain data associated with the photovoltaic panel and/or the power controller. For example, the wireless radio could be configured to receive a first signal containing a command for the power controller from the string wiring and to provide the command to the power controller. The wireless radio could also be configured to receive an acknowledgement associated with the command from the power controller and to transmit a second signal containing the acknowledgement over the string wiring for wireless transmission.

14 Claims, 4 Drawing Sheets

USE OF PHOTOVOLTAIC ARRAY STRING WIRING AS ANTENNA AND TRANSMISSION LINE FOR WIRED AND WIRELESS DATA COMMUNICATIONS

TECHNICAL FIELD

This disclosure relates generally to photovoltaic systems. More specifically, this disclosure relates to the use of a photovoltaic array's string wiring as an antenna and a transmission line for wired and wireless data communications.

BACKGROUND

Photovoltaic panels (solar panels) are routinely used to convert sunlight into electrical energy. In many photovoltaic systems, large arrays of photovoltaic panels are used to generate electrical energy. For example, an array could include a number of photovoltaic panels coupled in series to form a string, and multiple strings (possibly a large number of strings) can be coupled in parallel.

For some arrays, a direct current-to-direct current (DC-to-DC) controller is used with each individual photovoltaic panel or with subsets of photovoltaic panels (such as each string of panels). The DC-to-DC controllers represent voltage/current converters that can alter the power generated by the photovoltaic panels. The DC-to-DC controllers can be used to help increase array efficiency and overcome panel manufacturing tolerances, panel aging, and shading variations from panel to panel.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 5, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
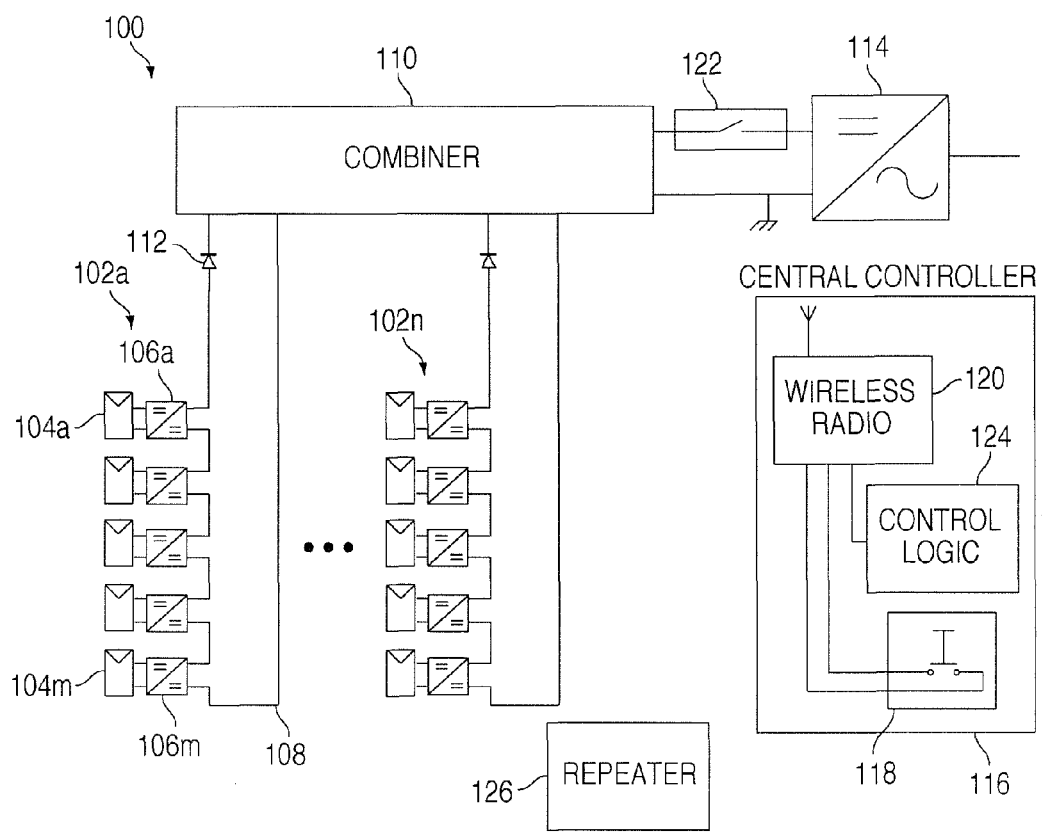
FIG. 1 illustrates an example photovoltaic system using string wiring as antennas and transmission lines for wired and wireless data communications according to this disclosure.

FIG. 1 illustrates an example photovoltaic system 100 using string wiring as antennas and transmission lines for wired and wireless data communications according to this disclosure. In this example embodiment, the system 100 includes multiple strings 102a-102n. Each string 102a-102n includes multiple photovoltaic panels 104a-104m and multiple power controllers 106a-106m. The strings 102a-102n form an array, which generates electrical power using sunlight or any other suitably bright light source. Each string 102a-102n could include any number of photovoltaic panels 104a-104m and any number of power controllers 106a-106m, such as twelve photovoltaic panels 104a-104m and twelve power controllers 106a-106m.

The photovoltaic panels 104a-104m convert solar energy into electrical energy. For example, the photovoltaic panels 104a-104m can convert solar energy into direct current (DC) energy, such as a DC output voltage and a DC output current. Each photovoltaic panel 104a-104m includes any suitable structure for converting solar energy into electrical energy.

The power controllers 106a-106m are coupled to the photovoltaic panels 104a-104m. The power controllers 106a-106m perform power conversion to alter the energy from the photovoltaic panels 104a-104m. For example, the power controllers 106a-106m could alter the DC voltage or DC current provided from the photovoltaic panels 104a-104m to string wiring 108. The power controllers 106a-106m could also perform other functions, such as power optimization. For instance, maximum power point tracking (MPPT) can be used to identify the output voltage and output current that provide a maximum or near-maximum amount of output power. Each of the power controllers 106a-106m could perform local or distributed MPPT to identify the output voltage and output current for its associated photovoltaic panel 104a-104m. The power controllers 106a-106m could also receive data from a central controller that performs centralized MPPT for multiple photovoltaic panels or strings.

Each of the power controllers 106a-106m includes any suitable structure for controlling power provided from at least one photovoltaic panel. In some embodiments, the power controllers 106a-106m include DC-to-DC converters. As a particular example, the power controllers 106a-106m could include SOLARMAGIC SM3320 modules from NATIONAL SEMICONDUCTOR CORPORATION. The SM3320 reference design provides a flexible platform for developing features in firmware with no additional hardware development. Examples of these features include module-level monitoring, security (like theft detection or deterrence), and identification. Similarly, firmware development on this platform can be used to customize the SM3320 modules to be compatible with any suitable monitoring system or inverter communication protocol.

The string wiring 108 in each string 102a-102n couples the power controllers 106a-106m to a power combiner 110. The string wiring 108 represents any suitable conductive wiring or other structure(s) for transporting DC power from one or more power controllers 106a-106m. In this example, a diode 112 is used to substantially limit current flow to a specified direction in the string wiring 108 of each string. The diodes 112 are also sometimes used to prevent current from strings that are operating to flow in strings that have been turned off. Each diode 112 includes any suitable structure for substantially limiting current flow to a single direction.

The power combiner 110 combines the power collected from the strings 102a-102n into a single output provided to a power converter 114. For example, the power combiner 110 could collect DC power from the power controllers 106a-106m over the string wiring 108 in the strings 102a-102n and output a DC voltage and DC current to the power converter 114. The power combiner 110 includes any suitable structure for combining power provided by multiple strings of photovoltaic panels.

The power converter 114 converts the power provided by the power combiner 110 into another form and outputs the converted power. For example, in some embodiments, the power converter 114 is coupled to an electrical grid, and the power converter 114 (also referred to as an "inverter") converts DC power from the power combiner 110 into alternating current (AC) power for the electrical grid. Note that any other conversion can occur using the power converter 114. The power converter 114 includes any suitable structure for converting power from one form to another.

A central controller 116 can control the operation of one or more photovoltaic arrays. For example, the central controller 116 could include a remote shutdown switch 118 and a wireless radio 120. The remote shutdown switch 118 could represent a manual switch that can be triggered by a user, and the wireless radio 120 could transmit a shutdown command when the remote shutdown switch 118 is triggered. In response, a DC disconnect switch 122 could open to disconnect the power combiner 110 from the power converter 114. This effectively blocks the transmission of DC power to the power converter 114, which also stops the transmission of AC power from the power converter 114. Moreover, the shutdown command could effectively disconnect power being generated by the panels 104a-104m from the string wiring 108 in each string 102a-102n. This may be necessary, for instance, during maintenance or in response to malfunctions or other problems.

The remote shutdown switch 118 includes any suitable structure capable of being triggered by a user. The DC disconnect switch 122 includes any suitable structure for selectively breaking an electrical connection. The wireless radio 120 includes any suitable structure for transmitting and/or receiving signals wirelessly. The wireless radio 120 could, for example, include a transmitter and a receiver that communicate over a shared antenna, although separate antennas could also be used. As a particular example, the wireless radio 120 could be implemented using one or more nRF2723 or other modules from NORDIC SEMICONDUCTOR on a printed circuit board.

The central controller 116 also includes control logic 124. The control logic 124 could implement any suitable functionality in the central controller 116. For example, as described above, the control logic 124 could perform centralized MPPT for the power controllers 106a-106m in one or more strings 102a-102n, such as by using data received from the power controllers 106a-106m. The control logic 124 could perform any other or additional functions in the central controller 116. The control logic 124 includes any suitable structure for providing control operations related to the photovoltaic system 100. For instance, the control logic 124 could include a microprocessor, microcontroller, digital signal processor, field programmable gate array, or application specific integrated circuit.

It is often necessary or desirable to have one-way or two-way communication with the power controllers 106a-106m associated with the photovoltaic panels 104a-104m. This may be used to support any number of features, such as reporting a photovoltaic panel's status, reporting a controller's status, or downloading firmware to a power controller. Other features could include reporting monitored characteristics like ambient temperature, reporting the anticipation of control needs, providing commands to turn on or off delivery of power, or providing commands to open or close a string circuit. Still other features could include reporting the presence of intruders or reporting the detection of arcing or corona. Two-way communication may be desirable, for instance, to support the use of acknowledgements indicating that certain commands have been executed locally by the power controllers 106a-106m. This may be particularly useful for shutdown commands, which can be acknowledged in order to ensure that power has been disconnected in the system 100. Shutdown commands can be useful during installation, maintenance, or emergency situations in which the system 100 is de-energized.

Providing a wired connection to each power controller 106a-106m in an array, however, would typically be cost-prohibitive, particularly given the number of photovoltaic panels and power controllers in a large array. Also, wireless communications are often difficult due to the shielding of the photovoltaic panels.

In one aspect of operation, the power controllers 106a-106m in each string 102a-102n can communicate wirelessly, such as with the central controller 116 or with power controllers 106a-106m in a different string. The power controllers 106a-106m in each string 102a-102n can use the string wiring 108 of that string as an antenna for the wireless communications. In this case, the string wiring 108 moves a signal from a power controller away from a photovoltaic panel's shadow to radiate more in the clear.

In a second aspect of operation, the power controllers 106a-106m in a string 102a-102n can communicate with each other using the string wiring 108. For example, one power controller could receive data wirelessly using the string wiring 108 as an antenna, and that power controller could then relay the data to other power controllers using the string wiring 108. This allows a power controller that receives a signal from a distance to relay the signal to an adjacent power controller that may not have received the signal. As long as one power controller receives a data message, it is possible with almost 100% certainty to guarantee that all other power controllers in the same string can receive the message.

In a third aspect of operation, the wireless transmission of data via the string wiring 108 can enable wireless communications between strings 102a-102n, not just with the central controller 116. This enables the power controllers 106a-106m in one string to communicate with the power controllers 106a-106m in other string(s).

The use of string wiring 108 as an antenna appears counter-intuitive. Many wireless radios have a 50Q input circuit, while the antenna (the string wiring 108) may have a random length and therefore present a random impedance value to the connection point of the input circuit. Also, it would likely be difficult to use an automatic tuning system to maintain an approximate impedance match between the wireless radio and the antenna within a photovoltaic panel's junction box (due to size and cost constraints). In addition, there is typically no practical way to control the string wiring's length or orientation, so the antenna's radiation pattern could not be effectively controlled. Moreover, all of this would occur within a multipath environment.

Owing, however, to the fact that the string wiring 108 travels away from the photovoltaic panels 104a-104m, the string wiring 108 can conduct and receive wireless signal away from the shadow of the photovoltaic panels. As a result, the shielding of the photovoltaic panels 104a-104m has a reduced effect on wireless transmission or reception using the string wiring 108. Moreover, adequate wireless range between the power controllers 106a-106m and the central controller 116 or between the power controllers 106a-106m can be obtained even when the power controllers 106a-106m are mounted inside the photovoltaic panels' junction boxes. In particular embodiments, transmissions using a 1 mW radio in a multipath environment could still obtain a range of 200 feet to 350 feet or more. This may be more than adequate in many photovoltaic systems, and longer ranges can be obtained using different implementations. This may also represent a longer range than achievable using a small dedicated antenna coupled to a photovoltaic panel's junction box or printed on or mounted to a printed circuit board.

In this way, wireless communications can occur between all panels of the strings 102a-102n and the central controller 116, as well as between the strings 102a-102n themselves. Moreover, data messages can be relayed within a string and between strings, helping to ensure that each message's intended destination is likely to receive the message either directly or indirectly. As a particular example of this functionality, under normal conditions the central controller 116 can transmit a signal to each power controller 106a-106m in each string 102a-102n indicating that output power can be generated and provided to the power combiner 110. When an emergency condition occurs, the central controller 116 can transmit a shutdown command to all power controllers 106a-106m, which de-energizes the output of the power controllers and ideally brings all DC voltages down to a safe level. Acknowledgement messages could then be provided from the power controllers 106a-106m to the central controller 116, allowing personnel to verify whether all power controllers 106a-106m have acknowledged the shutdown command.

Any suitable data messages could be transmitted in any suitable format within the system 100. The data messages could include alarm messages identifying problems with the system 100 (such as malfunctioning equipment) or the system's environment (such as the presence of an intruder). The data messages could also include commands and associated acknowledgements. The data messages could further include sensor measurements or any other data. The data messages could have any suitable size and format, such as 8-byte or 32-byte messages.

While not required, the system 100 could also include one or more wireless repeaters 126. Each repeater 126 could receive and then retransmit wireless signals, which can extend the wireless range between, for example, the strings 102a-102n and the central controller 116. Each repeater 126 could include any suitable structure for receiving and transmitting wireless signals. For instance, each repeater 126 could include a mast, an antenna, a receiver with store-and-forward functionality, a transmitter (possibly low-speed), and a power source. Any suitable power source could be used, such as a rechargeable battery and a very small (several square inch) solar panel. Each repeater 126 could have any suitable range, such as 150-300 feet. Each repeater 126 could also service any number of photovoltaic panels, such as 1,000 to 1,800 panels. Multiple repeaters 126 could be placed in any suitable configuration, such as when some repeaters 126 are placed in strategic positions around a cluster of photovoltaic panels (to obtain different propagation angles around the panels) and other repeaters 126 are placed in line with a specified separation. Each repeater 126 could also have multiple antennas, such as dual antennas spaced at an odd multiple of one-half the wireless wavelength in order to fill in nulls from multipath fading patterns (note that a similar antenna arrangement could be used in the central controller 116).

In particular embodiments, various ones of the following features could be supported in the system 100. The power controllers 106a-106m could enter a sleep mode and use very low current (such as several micro-amps), and a power drain can permit use of storage capacitors for limited nighttime use (such as for intruder detection). Also, the wireless communication range for the power controllers 106a-106m could be about 250 to 350 feet in order to permit the use of a smaller number of repeaters 126, and any suitable data transmission rate (such as 1 bps to 2 Mbps) could be used. The presence of the wireless communication system could result in the smallest possible loss of harvested energy. Modulation can be used to reduce or avoid interference, and the wireless system could be legal within virtually all nations of the world (such as by using the 2.4 GHz ISM band). Further, a coupling of wireless radios associated with the power controllers 106a-106m to the string wiring 108 could result in little to no harvested power loss since there are no extra wires to carry communication signals. In addition, the cost of implementing wireless communications using the power controllers could be under $2.00US per photovoltaic panel.

Although FIG. 1 illustrates one example of a photovoltaic system 100 using string wiring 108 as antennas and transmission lines for wired and wireless data communications, various changes may be made to FIG. 1. For example, the system 100 could include any number of strings, photovoltaic panels, power controllers, power combiners, power converters, central controllers, and repeaters in any suitable configuration. Also, while a one-to-one correspondence is shown between the photovoltaic panels and the power controllers, each power controller could be coupled to any number of photovoltaic panels.

Figure 2:
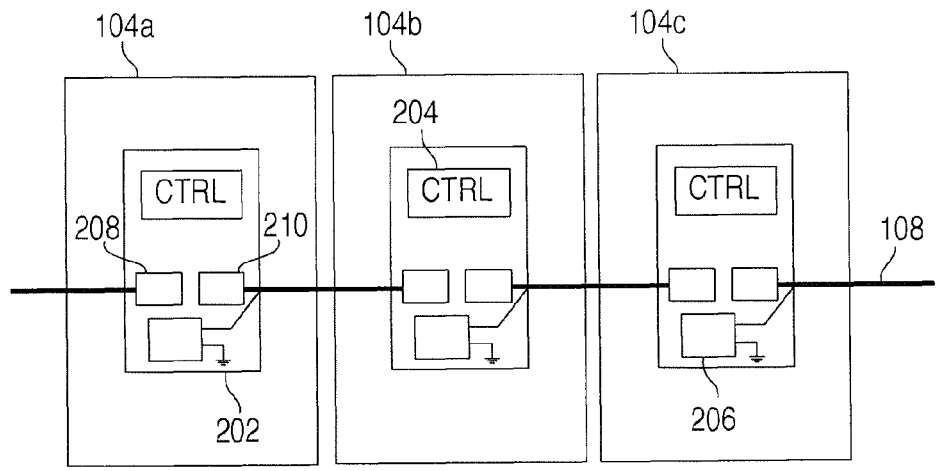
FIG. 2 illustrates an example string of photovoltaic panels using string wiring as an antenna and a transmission line for wired and wireless data communications according to this disclosure.

FIG. 2 illustrates an example string of photovoltaic panels 104a-104c using a string wiring 108 as an antenna and a transmission line for wired and wireless data communications according to this disclosure. In this example embodiment, each photovoltaic panel 104a-104c has an associated junction box 202, which contains various components used during operation of the photovoltaic panels 104a-104c. As shown in FIG. 2, each junction box 202 includes a power controller 204 and a wireless radio 206. The power controller 204 could, for example, represent the power controller 106a-106m of FIG. 1.

The wireless radios 206 support wired and wireless communications to and from the power controllers 204. For example, the wireless radios 206 could allow the power controllers 204 to communicate wirelessly with the central controller 116 using the string wiring 108 as an antenna. The wireless radios 206 could also allow the power controllers 204 in the same string to communicate with each other over the string wiring 108, such as to relay information received by one power controller 204 to the other power controllers 204. The wireless radios 206 could further allow the power controllers 204 in one string to communicate wirelessly with power controllers 204 in other string(s), such as to relay information received by a power controller 204 in one string to the power controllers 204 in another string.

Each wireless radio 206 includes any suitable structure supporting uni-directional or bi-directional wireless communication. Also, each wireless radio 206 could support any suitable modulation scheme, such as Gaussian frequency shift keying (GFSK) or other modulation. A wireless radio 206 could represent a transmitter, a receiver, or a transceiver. In some embodiments, the wireless radios 206 represent 2.4 GHz transceivers that use narrow-band modulation or direct sequence spread spectrum (with or without frequency hopping). As a particular example, each wireless radio 206 could represent an nRF24LE1 chip from NORDIC SEMICONDUCTOR, which includes a 2.4 GHz radio and an embedded 8051-compliant microcontroller on a single chip. This chip uses narrow-band modulation and supports a remote shutdown feature using the 8051 microcontroller. Narrow-band modulation using 2.4 GHz could provide at least 200 wireless channels and permit operation within narrow spectrum slots not used by popular services operating under WIFI and ZIGBEE standards. Note, however, that any other suitable wireless radios and wireless frequencies can be used.

Two RF chokes 208-210 couple each junction box 202 to the string wiring 108. In this example, the string wiring 108 is divided into segments, and each power controller 204 is coupled to two segments of the string wiring 108 by the RF chokes 208-210. The RF chokes 208-210 help to block RF signals on the string wiring 108 from reaching various components of the junction box 202, such as the power controller 204. The wireless radio 206, however, is coupled to the string wiring 108 outside of the RF chokes 208-210, allowing the wireless radio 206 to receive RF signals on the string wiring 108. Each RF choke 208-210 includes any suitable structure for at least substantially blocking RF signals.

Although FIG. 2 illustrates one example of a string of photovoltaic panels 104a-104c using string wiring 108 as an antenna and a transmission line for wired and wireless data communications, various changes may be made to FIG. 2. For example, the string could include any number of photovoltaic panels. Also, a single junction box 202 could be associated with one or multiple photovoltaic panels. Further, the components 204-210 need not all reside within a common structure (the junction box 202). In addition, the use of RF signals is for illustration only.

Figure 3:
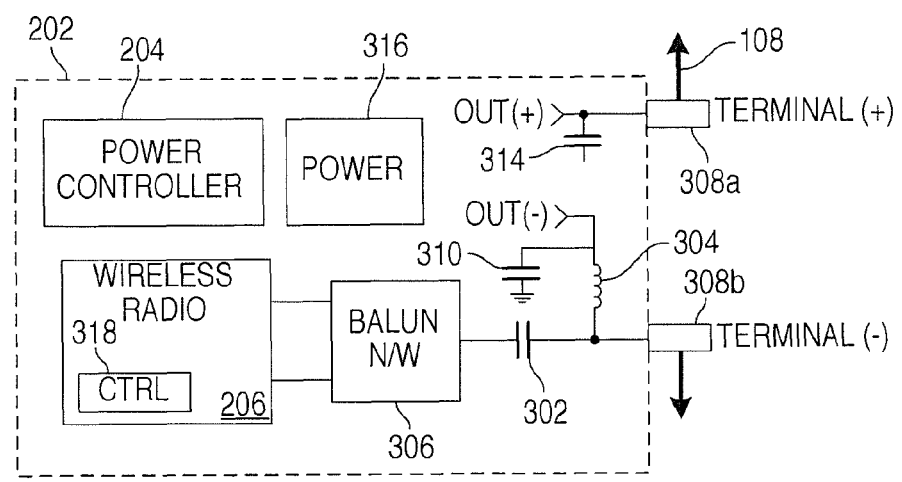
FIG. 3 illustrates an example assembly to be installed in a junction box for a photovoltaic panel using string wiring as an antenna and a transmission line for wired and wireless data communications according to this disclosure.

FIG. 3 illustrates an example assembly to be installed in a junction box 202 for a photovoltaic panel using string wiring 108 as an antenna and a transmission line for wired and wireless data communications according to this disclosure. In this example embodiment, the junction box 202 includes the power controller 204 and the wireless radio 206. In particular embodiments, the power controller 204 could represent a SOLARMAGIC SM72442 programmable MPPT controller from NATIONAL SEMICONDUCTOR CORPORATION, and the wireless radio 206 could represent an nRF24LE1 wireless radio from NORDIC SEMICONDUCTOR. The nRF24LE1 radio can be located in a SOLARMAGIC SM3320 board and used as a receiver that controls forced shutdown and panel-mode operation. Two GPIO outputs (P0.0 and P0.1) from the microcontroller can be used to send a shutdown or panel-mode signal to the SM72442 controller. The shutdown signal can pull a RESET pin low in order to deactivate PWM signals that are coming out of the SM72442 controller. Panel-mode operation can be forced in the SM72442 controller by pulling a PT pin of the SM72442 controller low.

A capacitor 302, an inductor 304, and a balun network 306 couple the wireless radio 206 to the string wiring 108. The capacitor 302 represents any suitable capacitive structure having any suitable capacitance. The inductor 304 represents any suitable inductive structure having any suitable inductance. The balun network 306 couples balanced outputs from the wireless radio 206 to the string wiring 108, which in this example is unbalanced. The balun network 306 includes any suitable structure for coupling balanced and unbalanced signals. Here, the inductor 304 is used to prevent the short-circuit of the wireless radio's output to ground. The inductor 304 is placed between the string wiring 108 and an output terminal OUT−. Output terminals OUT+ and OUT− represent the positive and negative outputs of the power controller 104, which are used to feed positive and negative terminals 308a-308b that are coupled to the string wiring 108.

A bypass capacitor 310 is coupled between the output terminal OUT− and ground. The capacitors 302, 310 and the inductor 304 create an L-network to couple RF signals to and from the negative string wiring terminal 308b without shorting it to the DC power feed. The L-network also helps to provide a better approximate match between the wireless radio 206 and the string wiring antenna. At the same time, they carry DC power from the power feed to the string wiring 108. The positive string wiring terminal 308a can have a bypass capacitor 314 to ground to provide a return for the RF through one or more ground planes to the wireless radio 206. This circuitry can convert the string wiring 108 into a dipole antenna, utilizing multiple segments of the string wiring 108 (note, however, that only a single segment could be used). The terminals 308a-308b are coupled to the string wiring 108 and provide power from the photovoltaic panel to the string wiring 108. The chokes 208-210 in FIG. 2 could be represented by the L-networks.

Note here that the layout assumes an adjacent ground plane is available. If the adjacent layer is a power plane, one or more bypass capacitors (such as three 0.01 μF and three 100 μF capacitors) can be added between the ground and power planes in the vicinity of the wireless radio 206. Also, the distance from an RF trace and a plane around it may be at least two times the width of the RF trace to avoid co-planar coupling that lowers line impedance (unless a co-planar ground floor is included within the calculation). In addition, the trace going into a crystal oscillator of the wireless radio 206 can be wide enough (such as about 15 mils) to reduce line inductance for more reliable starting at low temperatures. On the other hand, increasing these traces may also increase line capacitance to ground, which can affect starting as well. However, this effect can be counteracted, such as by reducing the capacitances of capacitors coupled to pins 28 and 29 of the nRF24LE1 wireless radio.

The junction box 202 here also includes a power supply 316. The power supply 316 can supply power to various components in the junction box 202, such as the wireless radio 206. In some embodiments, the wireless radio 206 is powered by energy harvested by a photovoltaic panel during the day and by the power supply 316 at night or at other times when the photovoltaic panel is harvesting little to no energy. The power supply 316 includes any suitable structure for supplying operating power to at least a wireless radio, such as a battery or high-value capacitors.

The wireless radio 206 here includes a communication controller 318. The controller 318 can be used to perform various functions associated with the wireless communication of data. For example, the controller 318 could control modulation, encryption, or other functions. As another example, in some embodiments, the wireless radio 206 could have fixed RF matching to the string wiring 108. In other embodiments, a variable impedance matching system could be used to obtain more efficient coupling to the string wiring 108 in order to achieve greater wireless range. The impedance matching system could, for instance, replace the capacitor 302 with a varactor diode, and a standing wave ratio bridge can be included in the signal path. A control mechanism (such as the communication controller 318) can be used to control the impedance matching system. The communication controller 318 could perform any other or additional functions.

Although FIG. 3 illustrates one example of an assembly to be installed in a junction box 202 for a photovoltaic panel using string wiring 108 as an antenna and a transmission line for wired and wireless data communications, various changes may be made to FIG. 3. For example, any other suitable components could be used to couple the wireless radio 206 to the string wiring 108.

Figure 4:
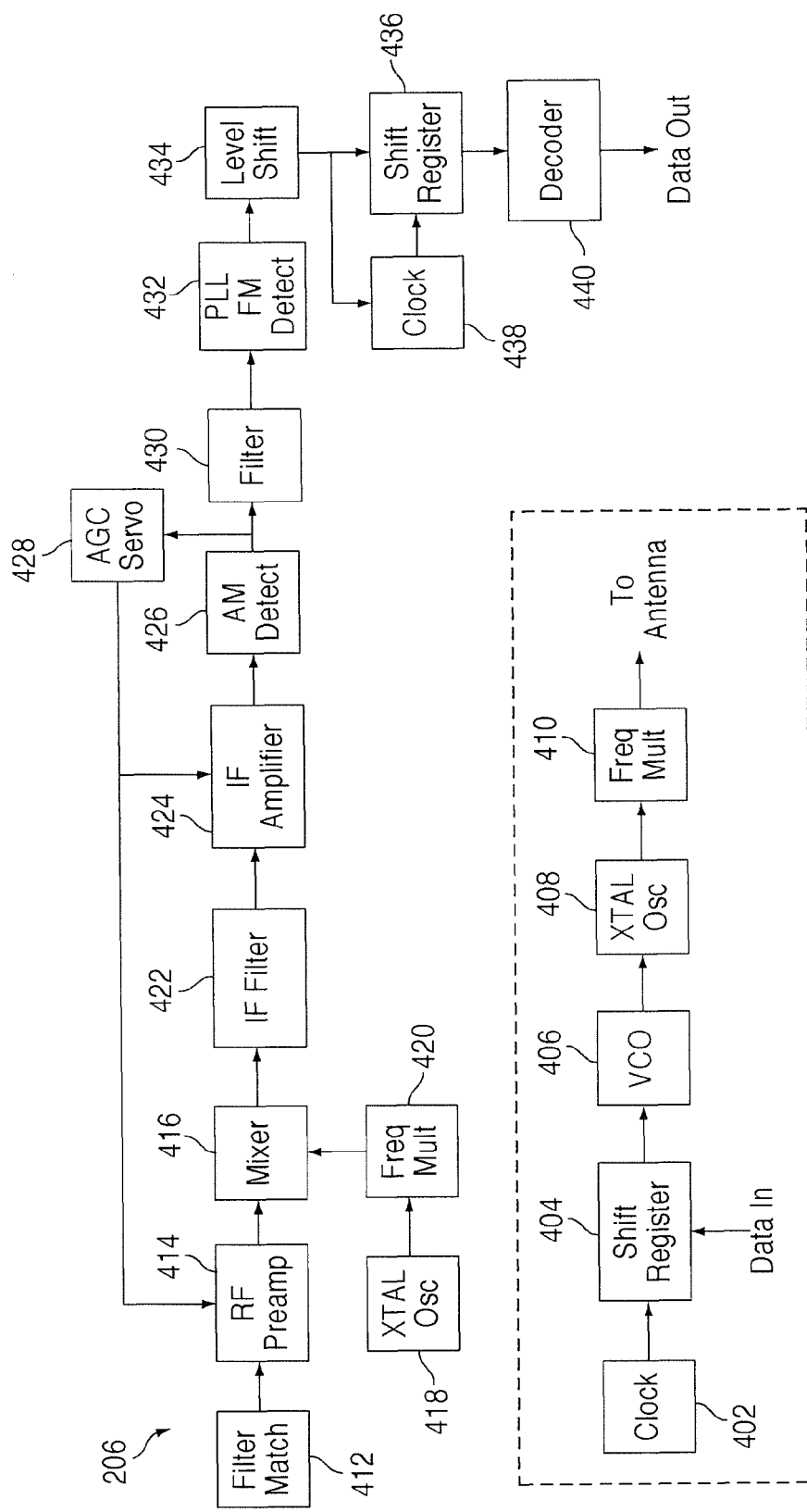
FIG. 4 illustrates an example wireless radio for a photovoltaic panel using string wiring as an antenna and a transmission line for wired and wireless data communications according to this disclosure.

FIG. 4 illustrates an example wireless radio 206 for a photovoltaic panel using string wiring 108 as an antenna and a transmission line for wired and wireless data communications according to this disclosure. In this example, components 402-410 form a transmitter that includes a clock source 402, a shift register 404, a voltage-controlled oscillator (VCO) 406, a crystal (XTAL) oscillator 408, and a frequency multiplier 410. The clock source 402 provides a clock signal having any suitable frequency, even low frequencies like 1 Hz. The shift register 404 uses the clock signal to shift input data, which is used as a control for the VCO 406. The output of the VCO 406 is used to turn the crystal oscillator 408 on and off, and the output of the crystal oscillator 408 is increased in frequency by the frequency multiplier 410. The frequency multiplier 410 outputs a signal to an antenna (the string wiring 108) for wireless transmission.

The components 412-440 form a receiver that includes a matching circuit and front end filter 412 for coupling to and receiving an incoming signal from the antenna (the string wiring 108). An RF preamplifier 414 amplifies the incoming signal, and a mixer 416 mixes the incoming signal with a signal from a crystal oscillator 418 as modified by a frequency multiplier 420 to generate an intermediate frequency (IF) signal. The IF signal could have any suitable frequency, such as about 10.7 MHz. The IF signal is filtered by an IF filter 422 and amplified by an IF amplifier 424.

An amplitude modulation (AM) detector 426 detects and outputs AM-modulated data recovered from the IF signal. The data can be used by an automatic gain control (AGC) servo 428 to adjust the operation of the RF preamplifier 414 and the IF amplifier 424. The data is also provided to a filter 430, such as a 1 kHz bandpass filter that is 2 kHz wide. The filtered data is provided to a phase-locked loop (PLL) frequency modulation (FM) detector 432, which provides recovered data to a level shifter 434. The level shifter 434 shifts the signal level of the data and provides the shifted data to a shift register 436 and a clock source 438. The clock source 438 provides a clock signal having any suitable frequency, even low frequencies like 1 Hz. The shift register 436 shifts data values based on the clock signal and outputs the values to a decoder 440, which outputs a signal indicative of whether the recovered data matches a specified pattern.

In this example, the wireless radio 206 can be extremely narrow-band, possibly on the order of one or several Hertz. Extremely narrow-band receivers can be very expensive because IF filters are expensive, as is the local oscillator since the frequency stability needed to place a signal into the IF filter is high. All of this is especially true for wide temperature requirements, such as exist for in photovoltaic systems. These problems can be circumvented, however, through the use of an amplitude-modulated subcarrier system. It is normally assumed that amplitude modulation is inferior to frequency modulation. However, in this application, with the use of amplitude modulation, the signal-to-noise ratio (SNR) of an incoming signal could be about 3 dB less after the AM detector 426 than before it, regardless of the SNR before the detector 426. Moreover, a narrow-band AM signal can be anywhere within the IF passband, relaxing the local oscillator frequency stability requirements. A low cost VHF or UHF receiver could have a system noise figure of 3 dB and an IF passband equal to about 300 kHz. This means that for a 6 dB SNR, the signal at the receiver input may only need to be about −110 dBm (0.7 μV into 50Ω). Typically, a 300 kHz spectral width for low-cost equipment can handle about 100 kbps, while for this application very low rates (such as 1 bps) could be used.

Suppose a VHF or UHF carrier signal is amplitude modulated with a 100 Hz subcarrier, which has been ±30 Hz frequency shift keyed at a 1 Hz rate to enable 2 bps to be sent. If the signal level at the receiver input is about −140 dBm (0.022 μV into 50Ω), the SNR at the output of the IF amplifier 424 feeding the AM detector 426 may be −24 dB and −27dB at the AM detector's output. The receiver can use AGC control to maintain the signal plus noise at the highest level the AM detector 426 can handle without overloading. If this level is 1V RMS, the 100 Hz subcarrier leaves the AM detector 426 at 44.7 mV, while 300 kHz of broadband noise is close to 1V RMS. Following the AM detector 426, the filter 430 can knock the noise down to 2.6 mV RMS and leave the signal at 44.7 mV. The output of the PLL FM detector 432 could then be a clean 1 bps output, and the data output by the shift register 436 can be examined by the decoder 440 to determine whether the data matches the pattern of an alarm condition or other pattern.

Although FIG. 4 illustrates one example of a wireless radio 206 for a photovoltaic panel using string wiring 108 as an antenna and a transmission line for wired and wireless data communications, various changes may be made to FIG. 4. For example, this represents one specific type of wireless radio 206 that can be used with photovoltaic panels. In particular, this represents one specific type of wireless radio that uses amplitude modulation of a frequency shift keyed signal to transmit low data-rate information. Any other suitable wireless radio could be used here.

Figure 5:
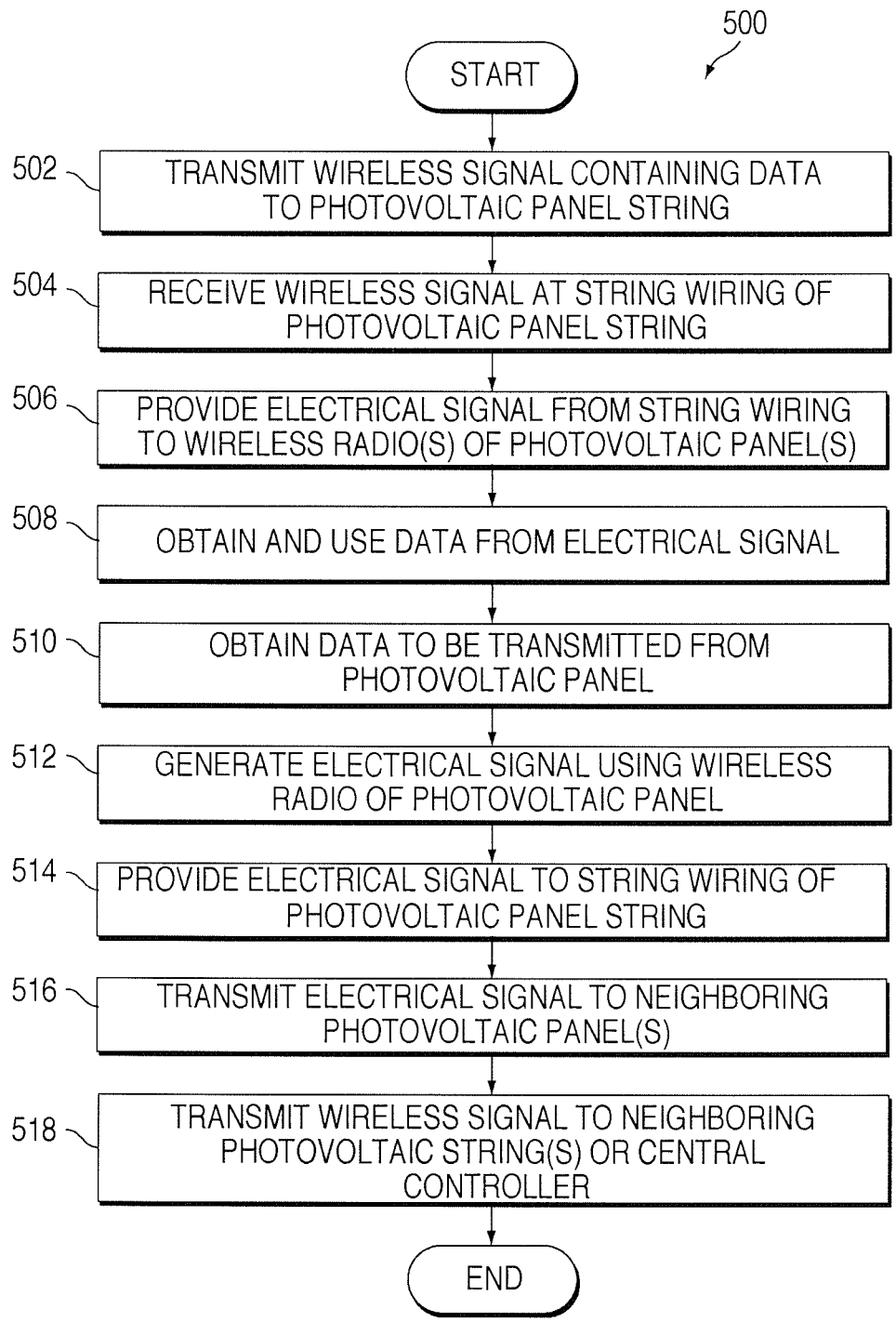
FIG. 5 illustrates an example method for using string wiring in a photovoltaic system as an antenna and a transmission line for wired and wireless data communications according to this disclosure.

FIG. 5 illustrates an example method 500 for using string wiring in a photovoltaic system as an antenna and a transmission line for wired and wireless data communications according to this disclosure. As shown in FIG. 5, a wireless signal containing data is transmitted to a photovoltaic panel string at step 502. This could include, for example, a central controller 116 broadcasting a wireless signal containing a shutdown command or other data for one or more strings 102a-102n. The wireless signal is received at the string wiring of the photovoltaic panel string at step 504. This could include, for example, the wireless signal being received by a portion of the string wiring 108 not shielded by the photovoltaic panels 104a-104m in the string. The wireless signal creates an electrical signal in the string wiring, which is provided to one or more wireless radios associated with one or more photovoltaic panels at step 506. The wireless radios obtain and use the data from the electrical signal at step 508. This could include, for example, the wireless radio(s) 206 demodulating the data contained in the electrical signal and providing the data to the power controller(s) 204. This may also include the power controller(s) 204 receiving the data, recognizing a shutdown or other command, and executing the command.

Data to be transmitted from a photovoltaic panel is obtained at step 510. This could include, for example, one or more power controllers 204 generating an acknowledgement for a previously-executed command or other data and providing the data to the wireless radio(s) 206. An electrical signal representing the data is generating using the wireless radio(s) at step 512. This could include, for example, the wireless radio(s) 206 modulating the data using AM, FM, or other modulation technique. The electrical signal is provided over the string wiring at step 514.

At this point, the electrical signal can be transmitted to neighboring photovoltaic panels at step 516. In this case, the electrical signal output by one wireless radio 206 over the string wiring 108 can be received and processed by other wireless radios 206 connected to the same string wiring 108. The electrical signal can also be transmitted wirelessly to neighboring photovoltaic strings or a central controller at step 518. In that case, the electrical signal output by one wireless radio 206 over the string wiring 108 can be radiated wirelessly to the string wiring 108 of nearby strings or to the central controller 116.

In this way, wireless signals can be sent to and received from strings of photovoltaic panels using the string wiring 108. Also, signals can be relayed among photovoltaic panels (both intra-string and inter-string) using the string wiring 108.

Although FIG. 5 illustrates one example of a method 500 for using string wiring 108 in a photovoltaic system as an antenna and a transmission line for wired and wireless data communications, various changes may be made to FIG. 5. For example, in some embodiments, communications with a photovoltaic panel could be uni-directional. Also, various steps in FIG. 5 could overlap, occur in parallel, occur in a different order, or occur multiple times.

In some embodiments, various functions described above are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory.

It may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
   terminals configured to be coupled to a string wiring of a photovoltaic string;
   a power controller configured to control a power provided over the string wiring by a photovoltaic panel in the photovoltaic string;
   a wireless radio configured to at least one of transmit and receive wireless signals using the string wiring as an antenna, the wireless signals containing data associated with one or more of: the photovoltaic panel and the power controller;
   wherein the wireless radio is further configured to communicate with at least one other wireless radio in the photovoltaic string using the string wiring as a wired transmission line; and
   further comprising:
   a power supply configured to provide power to at least the wireless radio;
   wherein the wireless radio is configured to be powered by energy harvested from the photovoltaic panel during a first time period and to be powered by energy from the power supply during a second time period; and
   further comprising:
   multiple wireless signal chokes or L-networks coupled to the terminals and configured to substantially block electrical signals represent the wireless signals on the string wiring;
   wherein the wireless radio is coupled to one of the terminals outside of the wireless signal chokes or L-networks.

2. The apparatus of claim 1, wherein:
   the wireless radio is configured to receive a first signal containing a command for the power controller from the string wiring and to provide the command to the power controller; and
   the wireless radio is configured to receive an acknowledgement associated with the command from the power controller and to transmit a second signal containing the acknowledgement over the string wiring for wireless transmission.

3. The apparatus of claim 1, wherein the wireless radio is configured to communicate wirelessly with at least one of: a central controller of a photovoltaic array and a different photovoltaic string.

4. The apparatus of claim 3, wherein the wireless radio is configured to relay received information to at least one of: the central controller and the different photovoltaic string.

5. The apparatus of claim 1, wherein the power controller is configured to perform maximum power point tracking for the photovoltaic panel.

6. The apparatus of claim 1, wherein the wireless radio is configured to communicate wirelessly using amplitude modulation of a frequency shift keyed signal.

7. The apparatus of claim 1, further comprising circuitry configured to couple the wireless radio to multiple segments of the string wiring such that the multiple segments form a dipole antenna for the wireless radio.

8. A system comprising:
   multiple photovoltaic panels in a photovoltaic string;
   one or more power controllers configured to control a power provided by the photovoltaic panels over a string wiring of the photovoltaic string;
   one or more wireless radios, each wireless radio configured to at least one of transmit and receive wireless signals using the string wiring as an antenna, the wireless signals containing data associated with one or more of: the photovoltaic panels and the one or more power controllers;
   wherein:
   the photovoltaic string comprises one of multiple strings; and the system further comprises:
   a power combiner configured to combine the power provided by the photovoltaic panels in the multiple strings; and
   a power converter configured to convert a combined power provided by the power combiner; and
   also wherein the one or more wireless radios are further configured to communicate with each other using the string wiring as a wired transmission line.

9. The system of claim 8, wherein the system comprises multiple power controllers, each power controller associated with one of the photovoltaic panels in the photovoltaic string.

10. The system of claim 8, further comprising:
a central controller configured to communicate wirelessly with the one or more power controllers via the one or more wireless radios.

11. The system of claim 10, wherein:
the central controller is configured to wirelessly communicate commands to the one or more power controllers via the one or more wireless radios; and
the central controller is configured to wirelessly receive acknowledgements from the one or more power controllers via the one or more wireless radios.

12. The system of claim 10, wherein:
the photovoltaic string comprises one of multiple strings; and
the one or more wireless radios in one string are configured to relay received information to at least one of: the central controller and a different one of the photovoltaic strings.

13. A method comprising:
receiving power from a photovoltaic panel in a photovoltaic string at a power controller;
controlling the power provided by the photovoltaic panel over a string wiring of the photovoltaic string;
at least one of transmitting and receiving wireless signals using the string wiring as an antenna, the wireless signals containing data associated with one or more of: the photovoltaic panel and the power controller; and
further comprising:
communicating with at least one neighboring power controller in the photovoltaic string using the string wiring as a wired transmission line; and
relaying information received wirelessly to at least one neighboring photovoltaic string using the string wiring.

14. The method of claim 13, wherein at least one of transmitting and receiving the wireless signals comprises:
receiving from the string wiring a first signal containing a command for the power controller;
providing the command to the power controller;
receiving an acknowledgement associated with the command from the power controller; and
transmitting a second signal containing the acknowledgement over the string wiring for wireless transmission.

* * * * *